United States Patent
Miller (10) Patent No.: US 9,249,500 B2
(45) Date of Patent: Feb. 2, 2016

(54) PVD RF DC OPEN/CLOSED LOOP SELECTABLE MAGNETRON

(71) Applicant: APPLIED MATERIALS, INC., Santa Clara, CA (US)

(72) Inventor: Keith A. Miller, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 268 days.

(21) Appl. No.: 13/761,267

(22) Filed: Feb. 7, 2013

(65) Prior Publication Data

US 2014/0216923 A1 Aug. 7, 2014

(51) Int. Cl.
| | |
|---|---|
| *C23C 14/34* | (2006.01) |
| *C23C 14/35* | (2006.01) |
| *H01J 37/32* | (2006.01) |
| *H01J 37/34* | (2006.01) |

(52) U.S. Cl.
CPC ............. *C23C 14/35* (2013.01); *H01J 37/3266* (2013.01); *H01J 37/32082* (2013.01); *H01J 37/32669* (2013.01); *H01J 37/345* (2013.01); *H01J 37/3408* (2013.01); *H01J 37/3452* (2013.01); *H01J 37/3455* (2013.01)

(58) Field of Classification Search
USPC ......................................... 204/298.19, 298.2
See application file for complete search history.

(56) References Cited

U.S. PATENT DOCUMENTS

| 6,440,282 | B1* | 8/2002 | Wada et al. ................. 204/298.2 |
|---|---|---|---|
| 7,018,515 | B2 | 3/2006 | Gung et al. |
| 8,021,527 | B2 | 9/2011 | Miller et al. |
| 2004/0082187 | A1 | 4/2004 | Chistyakov |
| 2005/0040030 | A1 | 2/2005 | McDonald |
| 2005/0133365 | A1 | 6/2005 | Hong et al. |
| 2007/0017798 | A1 | 1/2007 | Inagawa |
| 2007/0227876 | A1* | 10/2007 | Shamoun ................... 204/192.1 |
| 2009/0026073 | A1* | 1/2009 | Harada et al. ............ 204/298.16 |
| 2011/0311735 | A1 | 12/2011 | Wang et al. |

FOREIGN PATENT DOCUMENTS

KR 2011-0027909 A 3/2011

OTHER PUBLICATIONS

International Search Report and Written Opinion mailed Apr. 30, 2014 for PCT Application No. PCT/US2014/011304.

* cited by examiner

*Primary Examiner* — Jason M Berman
(74) *Attorney, Agent, or Firm* — Moser Taboada; Alan Taboada (57) ABSTRACT

Methods and apparatus for a magnetron assembly are provided herein. In some embodiments, a magnetron assembly includes a first plate having a first central axis, the first plate rotatable about the first central axis, a first open loop magnetic pole coupled to the first plate, a second plate having a second central axis, the second plate rotatable about the second central axis, and a second open loop magnetic pole coupled to the second plate, wherein the first open loop magnetic pole and the second open loop magnetic pole form a closed loop magnetic pole when the first and second open loop magnetic poles are aligned.

20 Claims, 7 Drawing Sheets

PVD RF DC OPEN/CLOSED LOOP SELECTABLE MAGNETRON

FIELD

Embodiments of the present invention generally relate to sputtering of materials. In particular, embodiments of the present invention relate to a magnetron for use in a physical vapor deposition chamber.

BACKGROUND

Sputtering, alternatively called physical vapor deposition (PVD), has long been used in depositing metals and related materials in the fabrication of semiconductor integrated circuits. Its use has been extended to depositing metal layers onto the sidewalls of high aspect-ratio holes such as vias or other vertical interconnect structures. Currently, advanced sputtering applications include depositing a metallic seed layer for later electroplating of the metallic layer in the via and depositing a barrier layer on the dielectric material of the via sidewall to prevent the metallic layer from diffusing into the dielectric.

Plasma sputtering may be accomplished using either DC sputtering or RF sputtering. Plasma sputtering typically includes a magnetron positioned at the back of the sputtering target to project a magnetic field into the processing space to increase the density of the plasma and enhance the sputtering rate. Magnets used in the magnetron are typically closed loop for DC sputtering and open loop for RF sputtering. DC plasmas closely confine the electrons into a closed loop race track or else the target voltage becomes very high and does not support sputtering at reasonable voltage and pressure. RF sputtering is very flexible and can work with almost any magnetic field, but if the field is too high, then the plasma can over-concentrate in the race track area. Any over concentration of the RF plasma can lead to very low target voltages and very low sputter rates. However, typical magnetrons do not provide both open loop and closed loop PVD magnets to be selectively used based on the type of sputtering required (i.e., DC or RF sputtering).

Thus, the inventors have provided a magnet configuration that can advantageously provide both DC and RF plasma confinement in the same chamber with the same hardware.

SUMMARY

Methods and apparatus for a magnetron assembly are provided herein. In some embodiments, a magnetron assembly includes a first plate having a first central axis, the first plate rotatable about the first central axis, a first open loop magnetic pole coupled to the first plate, a second plate having a second central axis, the second plate rotatable about the second central axis, and a second open loop magnetic pole coupled to the second plate, wherein the first open loop magnetic pole and the second open loop magnetic pole form a closed loop magnetic pole when the first and second open loop magnetic poles are aligned.

In some embodiments, a substrate processing system may include a process chamber having an inner volume and a substrate support disposed therein, a target assembly disposed in an upper portion of the inner volume opposing the substrate support, and a magnetron assembly disposed proximate the target assembly on a side opposite the substrate support, the magnetron assembly including a first plate having a first central axis, the first plate rotatable about the first central axis, a first open loop magnetic pole coupled to the first plate, a second plate having a second central axis, the second plate rotatable about the second central axis, and a second open loop magnetic pole coupled to the second plate, wherein the first open loop magnetic pole and the second open loop magnetic pole form a closed loop magnetic pole when the first and second open loop magnetic poles are aligned.

In some embodiments, a method of processing a substrate in a physical vapor deposition (PVD) chamber comprises applying a first RF power at a VHF frequency to a target comprising a metal disposed above the substrate to form a plasma from a plasma-forming gas, applying DC power to the target to direct the plasma towards the target, rotating a first plate of magnetron above the target while directing the plasma towards the target, the first plate of the magnetron having a first open loop magnetic pole, rotating a second plate of magnetron above the target while directing the plasma towards the target, the second plate of the magnetron having a second open loop magnetic pole such that the first and second open loop magnetic poles align to form a closed loop magnetic pole at least once per 360 degree rotation of the first plate, wherein the first plate is disposed below the second plate and rotatably supported by the second plate, sputtering metal atoms from the target using the plasma while maintaining a first pressure in the PVD chamber sufficient to ionize a predominant portion of the metal atoms sputtered from the target, and depositing the ionized metal atoms on the substrate to form a layer thereon.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

The present invention relates to a magnetron for providing a more uniform erosion pattern of a target and deposition profile on a substrate and physical vapor deposition (PVD) chambers incorporating such magnetrons. More specifically, exemplary embodiments of the present invention place portions of magnetic material on two separate plates with separate axes of rotation behind the sputter target that can be rotated to form open and closed loop magnetic poles (i.e., "magnetic tracks") as desired. In this way, controlling the phase angle between the two rotating axes would control the relative position of the generated magnetic fields. That is, the magnetic track could be open loop or closed loop, controlled by phase control of the motors driving the respective axes. Exemplary magnetron assemblies are described below.

Figure 1:
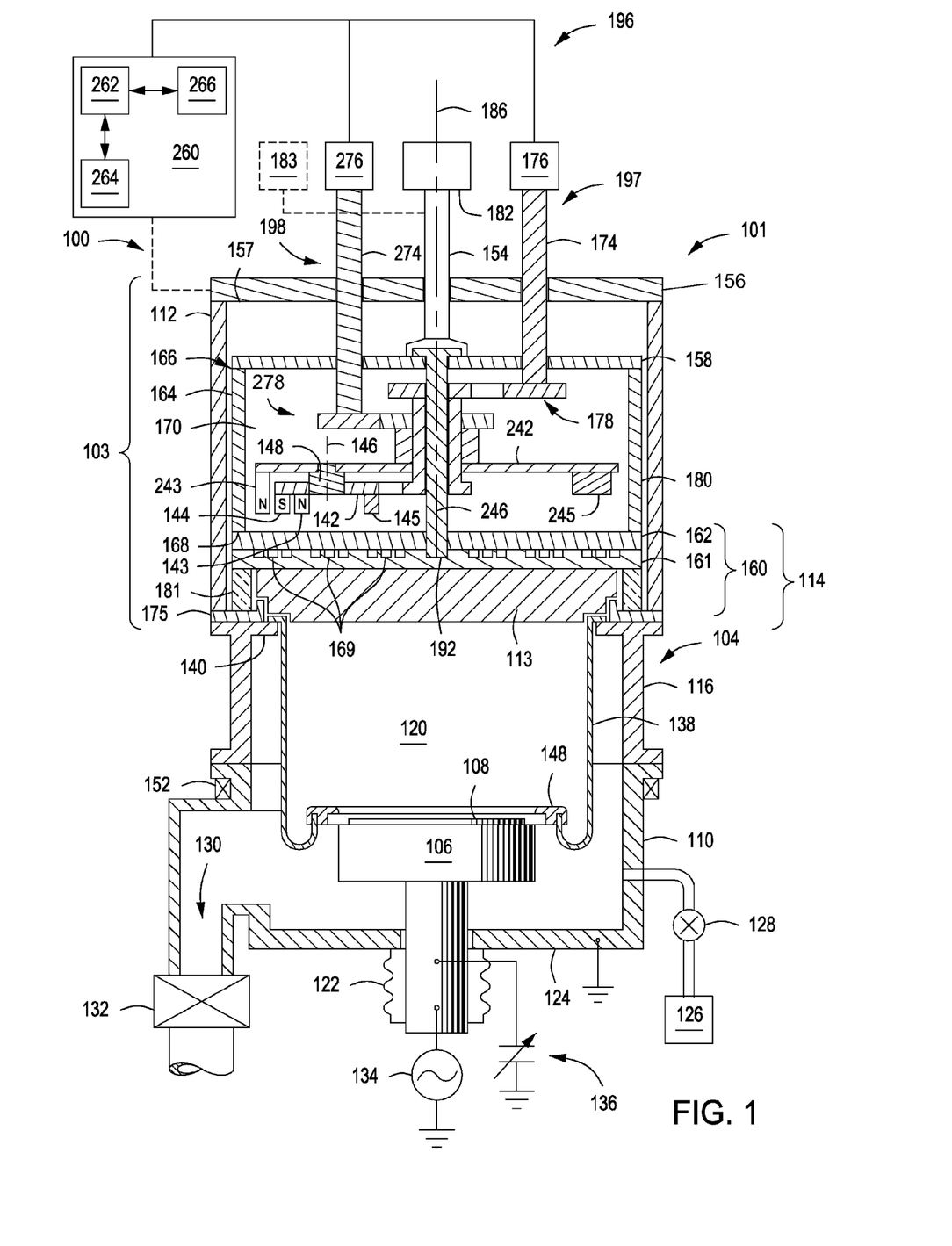
FIG. 1 depicts a schematic cross sectional view of a process chamber in accordance with some embodiments of the present invention.

FIG. 1 depicts a simplified, cross-sectional view of a physical vapor deposition (PVD) processing system 100 in accordance with some embodiments of the present invention. Examples of other PVD chambers suitable for modification in accordance with the teachings provided herein include the ALPS® Plus and SIP ENCORE® PVD processing chambers, both commercially available from Applied Materials, Inc., of Santa Clara, Calif. Other processing chambers from Applied Materials, Inc. or other manufactures, including those configured for other types of processing besides PVD, may also benefit from modifications in accordance with the teachings disclosed herein.

In some embodiments of the present invention, the PVD processing system 100 includes a chamber lid 101 removably disposed atop a process chamber 104. The chamber lid 101 may include a target assembly 114 and a grounding assembly 103. The process chamber 104 contains a substrate support 106 for receiving a substrate 108 thereon. The substrate support 106 may be located within a lower grounded enclosure wall 110, which may be a chamber wall of the process chamber 104. The lower grounded enclosure wall 110 may be electrically coupled to the grounding assembly 103 of the chamber lid 101 such that an RF return path is provided to an RF or DC power source 182 disposed above the chamber lid 101. The RF or DC power source 182 may provide RF or DC power to the target assembly 114 as discussed below.

The PVD processing system 100 may include a source distribution plate 158 opposing a backside of the target assembly 114 and electrically coupled to the target assembly 114 along a peripheral edge of the target assembly 114. The PVD processing system 100 may include a cavity 170 disposed between the backside of the target assembly 114 and the source distribution plate 158. The cavity 170 may at least partially house a magnetron assembly 196 as discussed below. The cavity 170 is at least partially defined by the inner surface of a conductive support ring 164, a target facing surface of the source distribution plate 158, and a source distribution plate facing surface (e.g., backside) of the target assembly 114 (or backing plate assembly 160).

One or more portions of a magnetron assembly 196 may be disposed at least partially within the cavity 170. The magnetron assembly provides a rotating magnetic field proximate the target to assist in plasma processing within the process chamber 104. In some embodiments, the magnetron assembly 196 may include a first rotatable magnet assembly 197 that rotates a first magnet support plate 142 about a first central axis 146 of the first support plate 142, and a second rotatable magnet assembly 198 that rotates a second magnet support plate 242 about a second central axis 246 of the second support plate 242. In some embodiments, the first central axis 146 and the second central axis are not aligned (i.e., offset). In some embodiments, at least one of the first central axis 146 or the second central axis 246 may be aligned with a central axis 186 of the process chamber 104. In some embodiments, the first and second magnet support plates 142/242 may be disk shaped, or other suitable geometry for use in the process chamber 104.

In some embodiments, the first rotatable magnet assembly 197 includes a first motor 176, a first motor shaft 174, a first gear assembly 178, and the first magnet support plate 142. In some embodiments, the first magnet support plate 142 supports one or more magnets 143,144 and is configured to rotate the one or more magnets 143,144 about the first central axis 146. In some embodiments, at least one of the one or more magnets may be a first open loop magnetic pole 143 coupled to the first magnet support plate 142. The first open loop magnetic pole 143 may be an open geometric shape such as an arc or other type of curve or line as shown in FIGS. 2A-3B and discussed below. In some embodiments, at least one of the one or more magnets may be an inner magnetic pole 144 coupled to the first plate 142 and adjacent to the first open loop magnetic pole 143. The polarity of the first open loop magnetic pole 143 opposes the polarity of the inner magnetic pole 144. In some embodiments, the first open loop magnetic pole 143 and the inner magnetic pole 144 may be disposed on one side of the first magnet support plate 142. In such embodiments, a counterweight 145 may be used to balance the first magnet support plate 142 as it rotates.

In some embodiments, the second rotatable magnet assembly 198 includes a second motor 276, a second motor shaft 274, a second gear assembly 278, and the second magnet support plate 242. In some embodiments, the second magnet support plate 242 supports one or more magnets 243 and is configured to rotate the one or more magnets 243 about the second central axis 246. In some embodiments, at least one of the one or more magnets may be a second open loop magnetic pole 243 coupled to the second magnet support plate 242. The second open loop magnetic pole 243 may be an open geometric shape such as an arc or other type of curve or line as shown in FIGS. 2A-3B and discussed below. In some embodiments, the polarity of the second open loop magnetic pole 243 may be the same as the first open loop magnetic pole 143, and may oppose the polarity of the inner magnetic pole 144. In some embodiments, the second open loop magnetic pole 243 may be disposed on one side of the second magnet support plate 242. In such embodiments, a counterweight 245 may be used to balance the second magnet support plate 242 as it rotates.

Figure 2A:
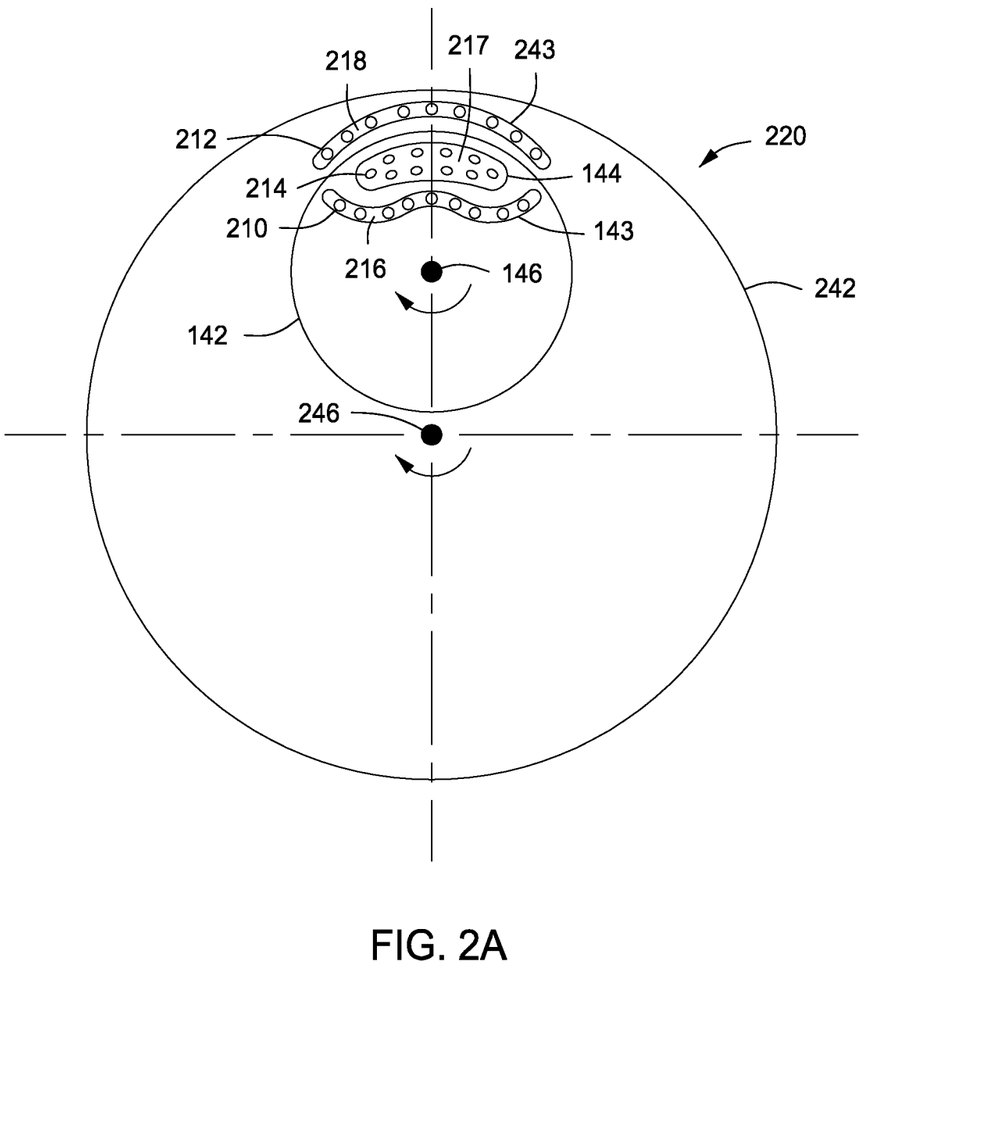
FIG. 2A is a bottom schematic view of rotating magnet support plates forming a closed loop magnetic pole in accordance with some embodiments of the present invention.
Figure 3A:
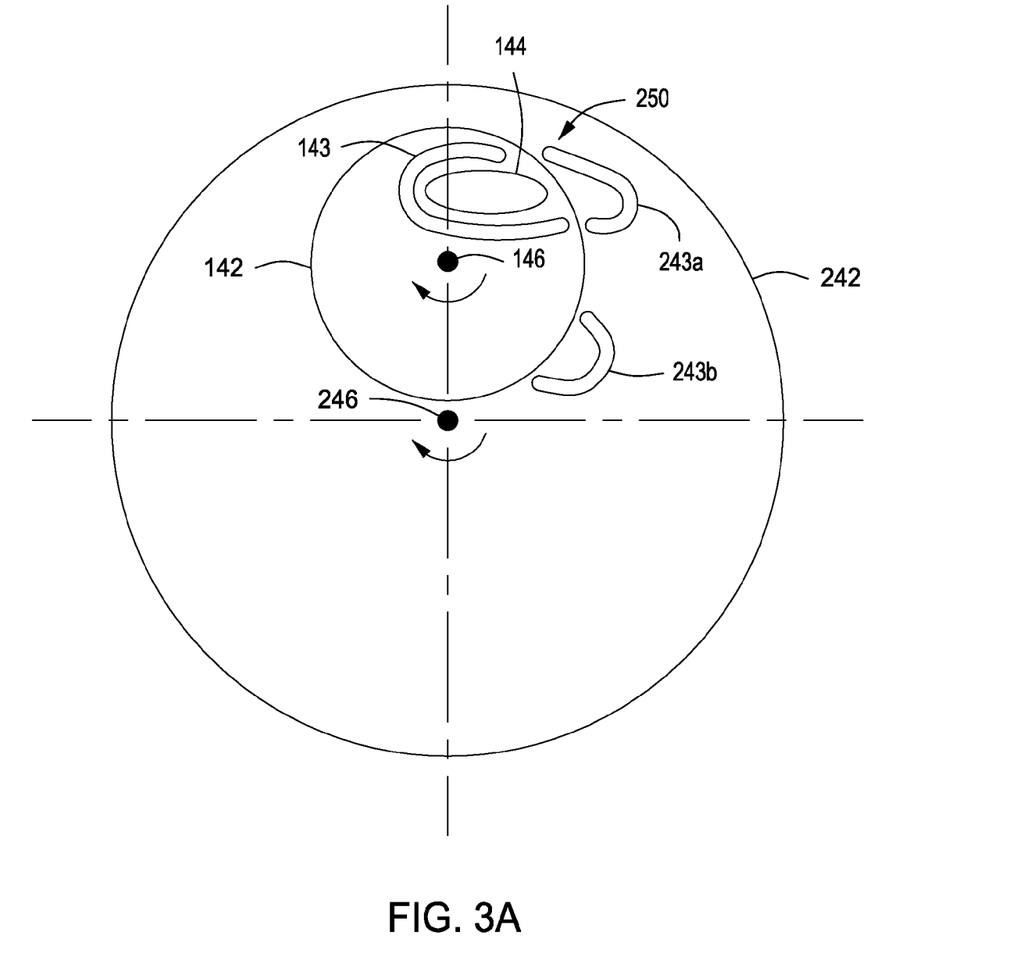
FIG. 3A is a bottom schematic view of rotating magnet support plates forming a first closed loop magnetic pole in accordance with some embodiments of the present invention.
Figure 3B:
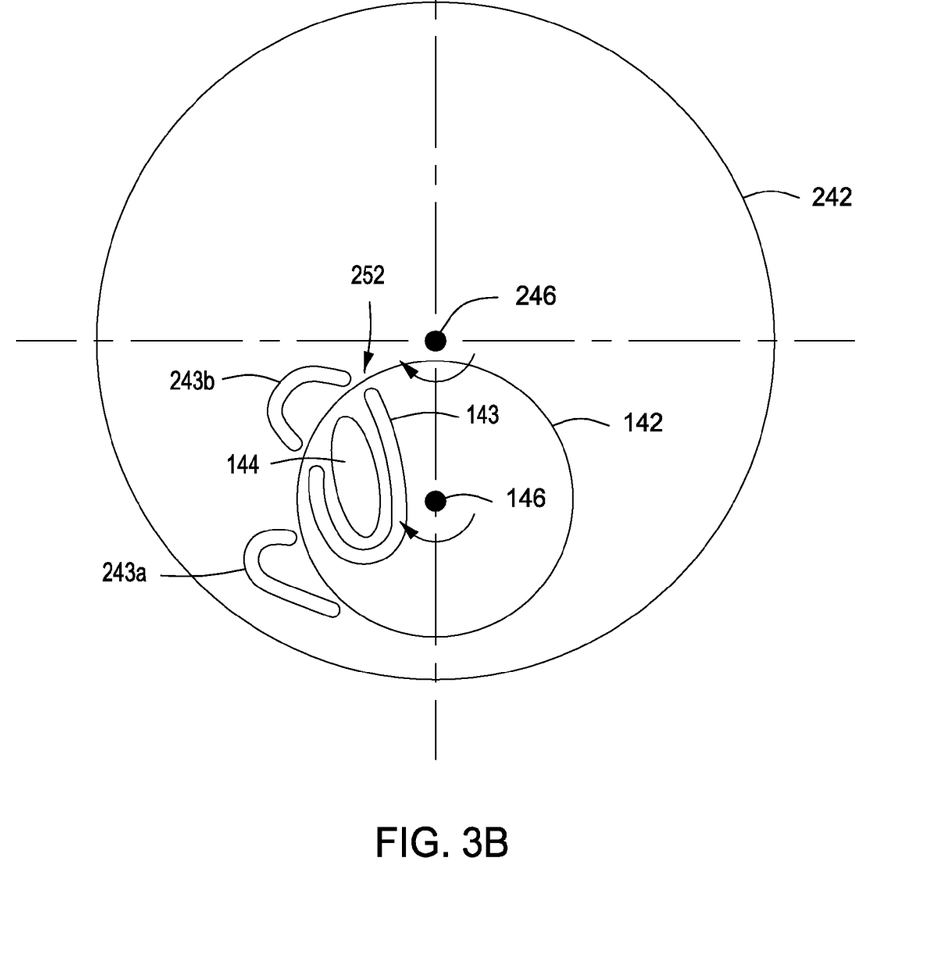
FIG. 3B is a bottom schematic view of rotating magnet support plates forming a second closed loop magnetic pole in accordance with some embodiments of the present invention.

In some embodiments, the first open loop magnetic pole 143 and the second open loop magnetic pole 243 form a closed loop magnetic pole about the inner magnetic pole 144 when the first and second open loop magnetic poles are aligned as shown in FIGS. 2A, 3A and 3B and discussed below.

In some embodiments, the magnetron assembly 196 is rotated within the cavity 170. For example, in some embodiments, the motors 176/276, motor shafts 174/274, and gear assemblies 178/278, may be provided to rotate the magnet support plates 142/242. In conventional PVD chambers having magnetrons, the magnetron drive shaft is typically disposed along the central axis of the chamber, preventing the coupling of RF energy in a position aligned with the central axis of the chamber. To the contrary, in embodiments of the present invention, the electrode 154 is aligned with the central axis 186 of the process chamber, and motor shafts 174/274 of the magnetron may be disposed through off-center openings in the ground plate 156. The ends of motor shafts 174/274 protruding from the ground plate 156 are coupled to the first and second motor 176/276, respectively. The motor shafts 174/274 are further disposed through corresponding off-center openings through the source distribution plate 158 and coupled to a gear assemblies 178/278, respectively.

The gear assemblies 178/278 may be supported by any suitable means, such as by being coupled to a bottom surface of the source distribution plate 158. The gear assemblies 178/278 may be insulated from the source distribution plate 158 by fabricating at least the upper surface of the gear assemblies 178/278 from a dielectric material, or by interposing an insulator layer (not shown) between the gear assemblies 178/278 and the source distribution plate 158, or the like, or by constructing the motor drive shafts 174/276 out of suitable dielectric material. The gear assemblies 178/278 are further coupled to the magnet support plates 142/242 to transfer the rotational motion provided by the motors 176/276 to the magnet support plates 142/242 (and hence, the one or more magnetic poles 143,144, 243). In some embodiments, the gear assemblies 178/278 may be coupled to the magnet support plates 142/242 through the use of pulleys, gears, or other suitable means of transferring the rotational motion provided by the motors 176/276.

The magnet support plates 142/242 may be constructed from any material suitable to provide adequate mechanical strength to rigidly support the one or more magnetic poles 143,144, 243. For example, in some embodiments, magnet support plates 142/242 may be constructed from a non-magnetic metal, such as non-magnetic stainless steel. The magnet support plates 142/242 may have any shape suitable to allow the one or more magnetic poles 143,144, 243 to be coupled thereto in a desired position. For example, in some embodiments, the magnet support plates 142/242 may comprise a plate, a disk, a cross member, or the like. In some embodiments, the first magnet support plate may be about 500 mm in diameter to about 800 mm in diameter. In some embodiments, the second magnet support plate may be about 250 mm in diameter to about 400 mm in diameter. The one or more magnetic poles 143,144, 243 may be configured in any manner to provide a magnetic field having a desired shape and strength.

Alternatively, the magnet support plates 142/242 may be rotated by any other means with sufficient torque to overcome the drag caused on the magnet support plates 142/242 and attached one or more magnetic poles 143,144, 243, when present, in the cavity 170. The motors 176/276 may be an electric motor, a pneumatic or hydraulic drive, or any other process-compatible mechanism that can provide the required torque.

Figure 2B:
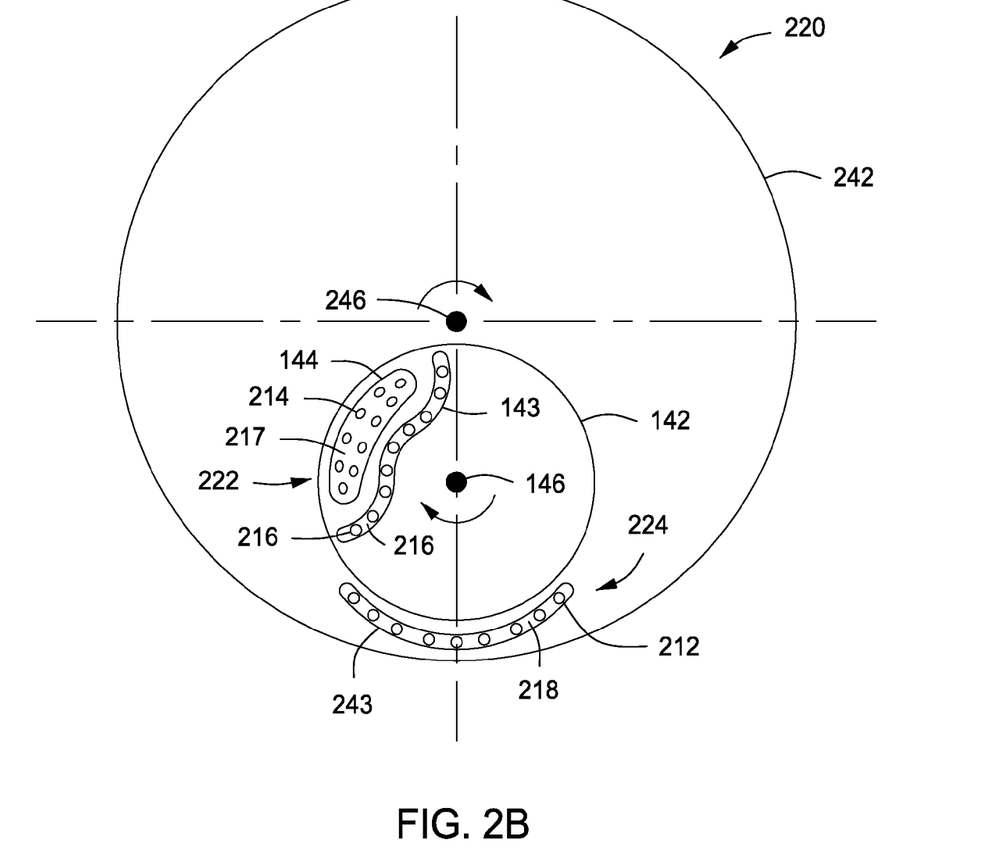
FIG. 2B is a bottom schematic view of rotating magnet support plates forming open loop magnetic tracks in accordance with some embodiments of the present invention.

As discussed above, closed loop magnetic poles are typically used for DC PVD sputtering and open loop magnetic poles are preferable for RF PVD sputtering operations. DC plasmas typically require that the electrons of a plasma are closely confined into a closed loop race track or else the target voltage becomes very high and does not support sputtering at reasonable voltage and pressure. Meanwhile, RF sputtering is very flexible and can work with almost any magnetic field, but if the field is too high, then the plasma can over-concentrate in the race track area. Any over concentration of the RF plasma can lead to very low target voltages and very low sputter rates. FIGS. 2A and 2B depict bottom schematic views of the first magnet support plate 142 and the second magnet support plate 242 rotating in different positions to form both a closed loop magnetic track 220 about the inner magnetic pole 144 (FIG. 2A) for use in DC PVD sputtering operations, and one or more open loop magnetic track 222/224 (FIG. 2B) for use in RF PVD sputtering operations.

In FIGS. 2A and 2B, the second magnet support plate 242 rotates about central axis 246. In some embodiments, the first magnet support plate 142 is disposed beneath, and supported by, the second magnet support plate 242 via a rotatable couple 148 as shown in FIG. 1. As the second magnet support plate 242 rotates about central axis 246, the first magnet support plate 142 rotates about central axis 146. FIG. 2A shows the first magnet support plate 142 and the second magnet support plate 242 rotated in a first position to align the first and second magnetic poles 143/243 to form a closed loop magnetic pole 220 about the inner magnetic pole 144. Meanwhile, FIG. 2B shows the first magnet support plate 142 and the second magnet support plate 242 rotated in a second position where the first and second magnetic poles 143/243 are not aligned forming one or more open loop magnetic tracks 222/224.

In some embodiments, the first magnet support plate 142 may be fixed in a position to form closed magnetic pole 220 as the second magnet support plate 242 rotates about central axis 246. In some embodiments, the magnet support plates 142/242 may rotate in the same direction, while in other embodiments they may rotate in opposite directions. In some embodiments, the position of the center of the first magnet support plate 142 (i.e., axis 146) is fixed in relation to the second magnet support plate 242.

Figure 4:
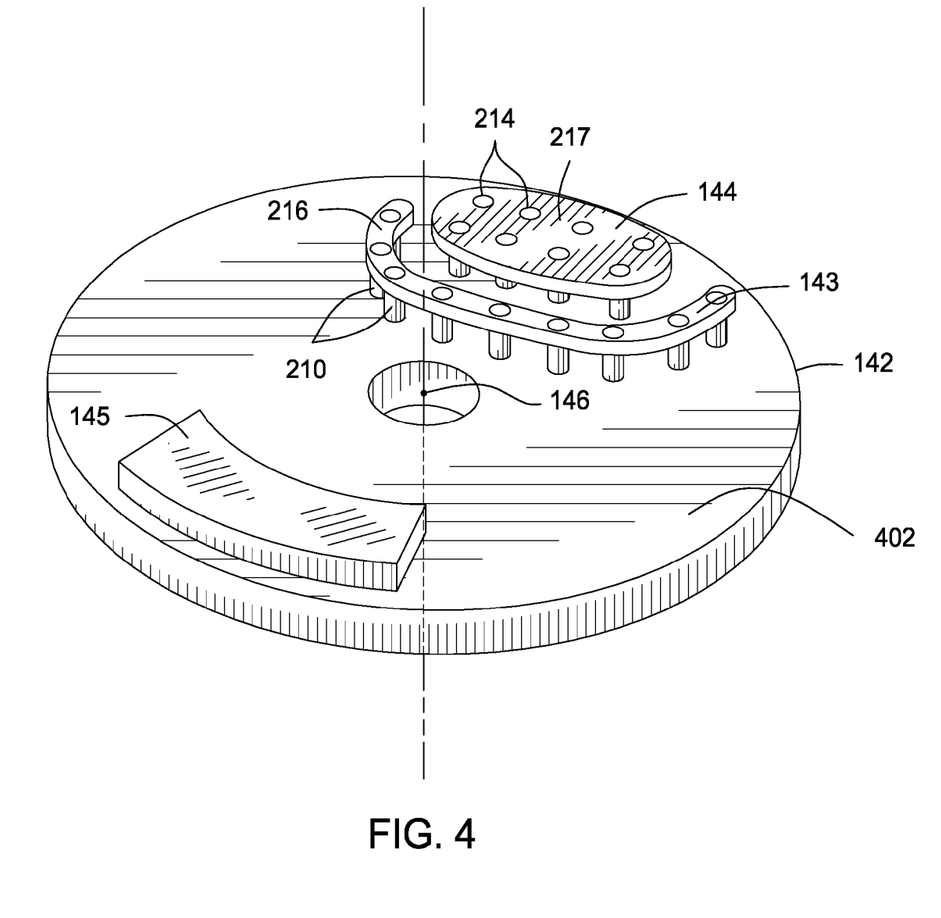
FIG. 4 is an isometric view of a first magnet support plate in accordance with some embodiments of the present invention.

In some embodiments, each of magnetic poles 143, 144 and 243 may consist of one or more magnetic slugs 210/212/214 coupled together via plates 216/217/218 as shown in FIG. 4. FIG. 4 depicts an isometric bottom view of the first magnet support plate 142 including counterweight 145, the first open magnetic pole 143 and the inner magnetic pole 144. As shown in FIG. 4, the first open magnetic pole 143 includes a plurality of magnetic slugs 210 coupled to plate 216 on one end, and coupled to the bottom surface 402 of the first open magnetic pole 143 on the other end. In some embodiments, the magnetic poles 143/144/243 may be bolted or bonded to the first and second magnet support plates 142/242. In some embodiments, the first magnetic pole and the inner magnetic pole may extend downward from the bottom surface 402 by about 25 mm to about 50 mm. In some embodiments, the second magnetic pole may extend downward from a bottom surface of the second magnet support plate at a distance to align the second open magnetic pole 243 with the first open magnetic pole 143.

The number of closed magnetic tracks that may be formed for each 360 degree rotation of the first magnet support plate 142 about central axis 146 may be from one closed loop magnetic pole (as discussed above with respect to FIGS. 2A and 2B), to a plurality of closed loop magnetic poles. For example, FIGS. 3A and 3B depict at least one other embodiment of the present invention where two closed loop magnetic poles 250/252 may be formed for each 360 degree rotation of the first magnet support plate 142 about central axis 146. In FIG. 3A, closed loop magnetic pole 250 is formed when the first magnet support plate 142 is rotated to a first position with respect to the second magnet support plate 242. Meanwhile, in FIG. 3B, closed loop magnetic pole 252 is formed when the first magnet support plate 142 is rotated to a second position with respect to the second magnet support plate 242.

In alternate embodiments, multiple open loop magnetic poles 143 may be disposed on the first magnet support plate 142 that may align with one or more open loop magnetic poles 243 disposed on the second magnet support plate 242. Still, in other embodiments, the inner magnet pole may be disposed on the second magnet support plate 242 along with the one or more open loop magnetic poles 243, while one or more open loop magnetic poles 143 are disposed on the first magnet support plate 142.

Referring back to FIG. 1, the substrate support 106 has a material-receiving surface facing a principal surface of a target assembly 114 and supports the substrate 108 to be sputter coated in planar position opposite to the principal surface of the target assembly 114. The substrate support 106 may support the substrate 108 in a central region 120 of the process chamber 104. The central region 120 is defined as the region above the substrate support 106 during processing (for example, between the target assembly 114 and the substrate support 106 when in a processing position).

In some embodiments, the substrate support 106 may be vertically movable to allow the substrate 108 to be transferred onto the substrate support 106 through a load lock valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104 while facilitating vertical movement of the substrate support 106. One or more gases may be supplied from a gas source 126 through a mass flow controller 128 into the lower part of the process chamber 104. An exhaust port 130 may be provided and coupled to a pump (not shown) via a valve 132 for exhausting the interior of the process chamber 104 and to facilitate maintaining a desired pressure inside the process chamber 104.

An RF bias power source 134 may be coupled to the substrate support 106 in order to induce a negative DC bias on the substrate 108. In addition, in some embodiments, a negative DC self-bias may form on the substrate 108 during processing. For example, RF energy supplied by the RF bias power source 134 may range in frequency from about 2 MHz to about 60 MHz, for example, non-limiting frequencies such as 2 MHz, 13.56 MHz, or 60 MHz can be used. In some embodiments, RF power may be supplied in a range from about 2 kW to about 20 kW. In some embodiments, DC power may be supplied in range from about 2 kW to about 40 kW. In other applications, the substrate support 106 may be grounded or left electrically floating. Alternatively or in combination, a capacitance tuner 136 may be coupled to the substrate support 106 for adjusting voltage on the substrate 108 for applications where RF bias power may not be desired.

The process chamber 104 further includes a process kit shield, or shield, 138 to surround the processing volume, or central region, of the process chamber 104 and to protect other chamber components from damage and/or contamination from processing. In some embodiments, the shield 138 may be connected to a ledge 140 of an upper grounded enclosure wall 116 of the process chamber 104. As illustrated in FIG. 1, the chamber lid 101 may rest on the ledge 140 of the upper grounded enclosure wall 116. Similar to the lower grounded enclosure wall 110, the upper grounded enclosure wall 116 may provide a portion of the RF return path between the lower grounded enclosure wall 110 and the grounding assembly 103 of the chamber lid 101. However, other RF return paths are possible, such as via the grounded shield 138.

The shield 138 extends downwardly and may include a generally tubular portion having a generally constant diameter that generally surrounds the central region 120. The shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A cover ring 148 rests on the top of an upwardly extending inner portion of the bottom shield 138 when the substrate support 106 is in its lower, loading position but rests on the outer periphery of the substrate support 106 when it is in its upper, deposition position to protect the substrate support 106 from sputter deposition. An additional deposition ring (not shown) may be used to protect the edges of the substrate support 106 from deposition around the edge of the substrate 108.

In some embodiments, a magnet 152 may be disposed about the process chamber 104 for selectively providing a magnetic field between the substrate support 106 and the target assembly 114. For example, as shown in FIG. 1, the magnet 152 may be disposed about the outside of the chamber wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 101 generally includes the grounding assembly 103 disposed about the target assembly 114. The grounding assembly 103 may include a grounding plate 156 having a first surface 157 that may be generally parallel to and opposite a backside of the target assembly 114. A grounding shield 112 may extend from the first surface 157 of the grounding plate 156 and surround the target assembly 114. The grounding assembly 103 may include a support member 175 to support the target assembly 114 within the grounding assembly 103.

In some embodiments, the support member 175 may be coupled to a lower end of the grounding shield 112 proximate an outer peripheral edge of the support member 175 and extends radially inward to support a seal ring 181, and the target assembly 114. The seal ring 181 may be a ring or other annular shape having a desired cross-section. The seal ring 181 may include two opposing planar and generally parallel surfaces to facilitate interfacing with the target assembly 114, such as the backing plate assembly 160, on a first side of the seal ring 181 and with the support member 175 on a second side of the seal ring 181. The seal ring 181 may be made of a dielectric material, such as ceramic. The seal ring 181 may insulate the target assembly 114 from the ground assembly 103.

The support member 175 may be a generally planar member having a central opening to accommodate the target assembly 114. In some embodiments, the support member 175 may be circular, or disc-like in shape, although the shape may vary depending upon the corresponding shape of the chamber lid and/or the shape of the substrate to be processed in the PVD processing system 100.

The target assembly 114 may comprise a source material 113 to be deposited on a substrate, such as the substrate 108 during sputtering, such as a metal, metal oxide, metal alloy, or the like. In embodiments consistent with the present invention, the target assembly 114 includes a backing plate assembly 160 to support the source material 113. The source material 113 may be disposed on a substrate support facing side of the backing plate assembly 160 as illustrated in FIG. 1. The backing plate assembly 160 may comprise a conductive material, such as copper-zinc, copper-chrome, or the same material as the target, such that RF and DC power can be coupled to the source material 113 via the backing plate assembly 160. Alternatively, the backing plate assembly 160 may be nonconductive and may include conductive elements (not shown) such as electrical feedthroughs or the like.

In some embodiments, the backing plate assembly 160 includes a first backing plate 161 and a second backing plate 162. The first backing plate 161 and the second backing plate 162 may be disc shaped, rectangular, square, or any other shape that may be accommodated by the PVD processing system 100. A front side of the first backing plate is configured to support the source material 113 such that a front surface of the source material opposes the substrate 108 when present. The source material 113 may be coupled to the first backing plate 161 in any suitable manner. For example, in some embodiments, the source material 113 may be diffusion bonded to the first backing plate 161.

A plurality of sets of channels 169 may be disposed between the first and second backing plates 161, 162. The first and second backing plates 161, 162 may be coupled together to form a substantially water tight seal (e.g., a fluid seal between the first and second backing plates) to prevent leakage of coolant provided to the plurality of sets of channels 169. In some embodiments, the target assembly 114 may further comprise a central support member 192 to support the target assembly 114 within the process chamber 104.

In some embodiments, the conductive support ring 164 may be disposed between the source distribution plate 158 and the backside of the target assembly 114 to propagate RF energy from the source distribution plate to the peripheral edge of the target assembly 114. The conductive support ring 164 may be cylindrical, with a first end 166 coupled to a target-facing surface of the source distribution plate 158 proximate the peripheral edge of the source distribution plate 158 and a second end 168 coupled to a source distribution plate-facing surface of the target assembly 114 proximate the peripheral edge of the target assembly 114. In some embodiments, the second end 168 is coupled to a source distribution plate facing surface of the backing plate assembly 160 proximate the peripheral edge of the backing plate assembly 160.

An insulative gap 180 is provided between the grounding plate 156 and the outer surfaces of the source distribution plate 158, the conductive support ring 164, and the target assembly 114 (and/or backing plate assembly 160). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 may be between about 15 mm and about 40 mm.

The grounding assembly 103 and the target assembly 114 may be electrically separated by the seal ring 181 and by one or more of insulators (not shown) disposed between the first surface 157 of the grounding plate 156 and the backside of the target assembly 114, e.g., a non-target facing side of the source distribution plate 158.

The PVD processing system 100 has an RF power source 182 connected to an electrode 154 (e.g., a RF feed structure). The electrode 154 may pass through the grounding plate 156 and is coupled to the source distribution plate 158. The RF power source 182 may include an RF generator and a matching circuit, for example, to minimize RF energy reflected back to the RF generator during operation. For example, RF energy supplied by the RF power source 182 may range in frequency from about 13.56 MHz to about 162 MHz or above. For example, non-limiting frequencies such as 13.56 MHz, 27.12 MHz, 40.68 MHz, 60 MHz, or 162 MHz can be used.

In some embodiments, PVD processing system 100 may include a second energy source 183 to provide additional energy to the target assembly 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to target assembly 114 in any location suitable to electrically couple the DC energy to the target assembly 114, such as the electrode 154 or some other conductive member (such as the source distribution plate 158, discussed below). In embodiments where the second energy source 183 is a second RF power source, the second energy source may be coupled to the target assembly 114 via the electrode 154.

The electrode 154 may be cylindrical or otherwise rod-like and may be aligned with a central axis 186 of the process chamber 104 (e.g., the electrode 154 may be coupled to the target assembly at a point coincident with a central axis of the target, which is coincident with the central axis 186). The electrode 154, aligned with the central axis 186 of the process chamber 104, facilitates applying RF energy from the RF source 182 to the target assembly 114 in an axisymmetrical manner (e.g., the electrode 154 may couple RF energy to the target at a "single point" aligned with the central axis of the process chamber). The central position of the electrode 154 helps to eliminate or reduce deposition asymmetry in substrate deposition processes. The electrode 154 may have any suitable diameter. For example, although other diameters may be used, in some embodiments, the diameter of the electrode 154 may be about 0.5 to about 2 inches. The electrode 154 may generally have any suitable length depending upon the configuration of the process chamber. In some embodiments, the electrode may have a length of between about 0.5 to about 12 inches. The electrode 154 may be fabricated from any suitable conductive material, such as aluminum, copper, silver, or the like. Alternatively, in some embodiments, the electrode 154 may be tubular. In some embodiments, the diameter of the tubular electrode 154 may be suitable, for example, to facilitate providing a central shaft for the magnetron.

The electrode 154 may pass through the ground plate 156 and is coupled to the source distribution plate 158. The ground plate 156 may comprise any suitable conductive material, such as aluminum, copper, or the like. The open spaces between the one or more insulators (not shown) allow for RF wave propagation along the surface of the source distribution plate 158. In some embodiments, the one or more insulators may be symmetrically positioned with respect to the central axis 186 of the PVD processing system. Such positioning may facilitate symmetric RF wave propagation along the surface of the source distribution plate 158 and, ultimately, to a target assembly 114 coupled to the source distribution plate 158. The RF energy may be provided in a more symmetric and uniform manner as compared to conventional PVD chambers due, at least in part, to the central position of the electrode 154.

A controller 260 may be provided and coupled to various components of the PVD processing system 100 to control the operation thereof. The controller 194 includes a central processing unit (CPU) 262, a memory 264, and support circuits 266. The controller 260 may control the PVD processing system 100 directly, or via computers (or controllers) associated with particular process chamber and/or support system components. The controller 260 may be one of any form of general-purpose computer processor that can be used in an industrial setting for controlling various chambers and sub-processors. The memory, or computer readable medium, 264 of the controller 260 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 266 are coupled to the CPU 262 for supporting the processor in a conventional manner. These circuits include cache, power supplies, clock circuits, input/output circuitry and subsystems, and the like. Inventive methods as described herein may be stored in the memory 264 as software routine that may be executed or invoked to control the operation of the PVD processing system 100 in the manner described herein, for example, to perform method 500 described below. The software routine may also be stored and/or executed by a second CPU (not shown) that is remotely located from the hardware being controlled by the CPU 262.

Figure 5:
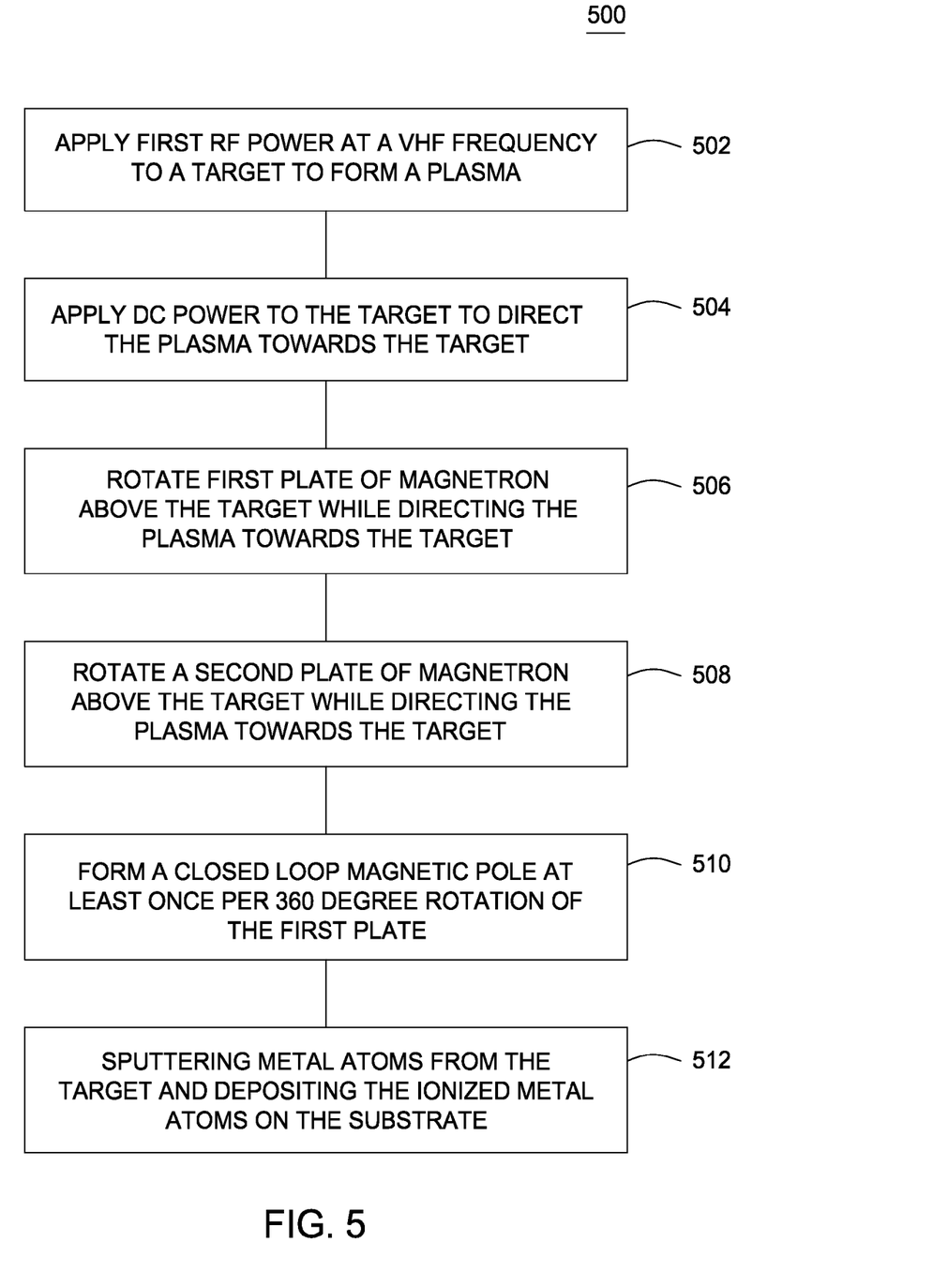
FIG. 5 is a flow chart for a method of depositing of processing a substrate in a physical vapor deposition (PVD) chamber in accordance with some embodiments of the present invention.

FIG. 5 is a flow diagram of a method 500 of processing a substrate in a physical vapor deposition (PVD) chamber using embodiments of the magnetron described above. At 502 a first RF power is applied at a VHF frequency to a target comprising a metal disposed above the substrate to form a plasma from a plasma-forming gas. At 504, a DC power is applied to the target to direct the plasma towards the target. At 506 the first plate (e.g., 142) of magnetron is rotated, for example, using motor 176, shaft 174, and gear assembly 178. The first plate is rotated above the target while directing the plasma towards the target. At 508, the second plate (e.g., 242) is rotated above the target while directing the plasma towards the target. The first plate is rotated with respect to the second plate such that the first and second open loop magnetic poles (e.g., 143/243) align to form a closed loop magnetic pole at least once per 360 degree rotation of the first plate at 510. At 512, metal atoms are sputtered from the target using the plasma while maintaining a first pressure in the PVD chamber sufficient to ionize a predominant portion of the metal atoms sputtered from the target, and the ionized metal atoms are deposited on the substrate to form a layer thereon.

While the foregoing is directed to embodiments of the present invention, other and further embodiments of the invention may be devised without departing from the basic scope thereof.

The invention claimed is:

1. A magnetron assembly, comprising:
  a first plate having a first central axis, the first plate rotatable about the first central axis;
  a first open loop magnetic pole coupled to the first plate;
  a second plate having a second central axis, the second plate rotatable about the second central axis; and
  a second open loop magnetic pole coupled to the second plate, wherein the second open loop magnetic pole is fixed to the second plate with respect to the second central axis proximate an outer diameter of the first plate, wherein the first central axis rotates about the second central axis, and wherein the first open loop magnetic pole and the second open loop magnetic pole form a closed loop magnetic pole when the first and second open loop magnetic poles are aligned.

2. The magnetron assembly of claim 1, further comprising an inner magnetic pole coupled to the first plate and adjacent to the first open loop magnetic pole, wherein the closed loop magnetic pole is formed about the inner magnetic pole when the first and second open loop magnetic poles are aligned.

3. The magnetron assembly of claim 2, wherein a first polarity of the first and second open loop magnetic poles opposes a second polarity of the inner magnetic pole.

4. The magnetron assembly of claim 1, further comprising an inner magnetic pole coupled to the second plate and adjacent to the first open loop magnetic pole, wherein the closed loop magnetic pole is formed about the inner magnetic pole when the first and second open loop magnetic poles are aligned.

5. The magnetron assembly of claim 4, wherein a first polarity of the first and second open loop magnetic poles opposes a second polarity of the inner magnetic pole.

6. The magnetron assembly of claim 1, wherein the first open loop magnetic pole further comprises a first pole piece, and a plurality of first magnets disposed between the first pole piece and the first plate, and wherein the second open loop magnetic pole further comprises a second pole piece, and a plurality of second magnets disposed between the second pole piece and the second plate.

7. The magnetron assembly of claim 1, wherein the first central axis of the first plate and the second central axis of the second plate are not aligned.

8. The magnetron assembly of claim 1, wherein the first plate is disposed below the second plate.

9. The magnetron assembly of claim 8, wherein the first open loop magnetic pole extends downward from a bottom surface of the first plate, and wherein the second open loop magnetic pole extends downward from a bottom surface of the second plate.

10. The magnetron assembly of claim 9, further comprising:
  a first shaft coupled to the first plate about the first central axis of the first plate and supports the first plate, wherein the first shaft is supported by the second plate, and wherein a position of the first shaft is fixed in relation to the second plate.

11. The magnetron assembly of claim 10, wherein the first plate is configured to rotate about the first shaft to align the first and second open loop magnetic poles and to form the closed loop magnetic pole about an inner magnetic pole.

12. The magnetron assembly of claim 11, further comprising:
  a second shaft coupled to the second plate about the second central axis of the second plate, wherein the second plate is configured to rotate about the second shaft.

13. The magnetron assembly of claim 1, wherein the first open loop magnetic pole is a plurality of open loop magnetic poles coupled to the first plate.

14. The magnetron assembly of claim 1, wherein the second open loop magnetic pole is a plurality of open loop magnetic poles coupled to the second plate.

15. A substrate processing system, comprising:
  a process chamber having an inner volume and a substrate support disposed therein;
  a target assembly disposed in an upper portion of the inner volume opposing the substrate support; and
  a magnetron assembly disposed proximate the target assembly on a side opposite the substrate support, the magnetron assembly comprising:
    a first plate having a first central axis, the first plate rotatable about the first central axis;
    a first open loop magnetic pole coupled to the first plate;
    a second plate having a second central axis, the second plate rotatable about the second central axis; and a second open loop magnetic pole coupled to the second plate, wherein the second open loop magnetic pole is fixed to the second plate with respect to the second central axis proximate an outer diameter of the first plate, wherein the first central axis rotates about the second central axis, and wherein the first open loop magnetic pole and the second open loop magnetic pole form a closed loop magnetic pole when the first and second open loop magnetic poles are aligned.

16. The substrate processing system of claim 15, wherein the magnetron assembly further includes an inner magnetic pole coupled to the first plate and adjacent to the first open loop magnetic pole, wherein the closed loop magnetic pole is formed about the inner magnetic pole when the first and second open loop magnetic poles are aligned.

17. The substrate processing system of claim 16, wherein a first polarity of the first and second open loop magnetic poles opposes a second polarity of the inner magnetic pole.

18. The substrate processing system of claim 15, wherein the magnetron assembly further includes an inner magnetic pole coupled to the second plate and adjacent to the first open loop magnetic pole, and wherein the closed loop magnetic pole is formed about the inner magnetic pole when the first and second open loop magnetic poles are aligned.

19. The substrate processing system of claim 15, wherein the first plate is disposed below the second plate, wherein the first open loop magnetic pole extends downward from a bottom surface of the first plate, and wherein the second open loop magnetic pole extends downward from a bottom surface of the second plate.

20. A method of processing a substrate in a physical vapor deposition (PVD) chamber, comprising:
applying a first RF power at a VHF frequency to a target comprising a metal disposed above the substrate to form a plasma from a plasma-forming gas;
applying DC power to the target to direct the plasma towards the target;
rotating a first plate of magnetron about a first central axis of the first plate above the target while directing the plasma towards the target, the first plate of the magnetron having a first open loop magnetic pole;
rotating a second plate of magnetron about a second central axis of the second plate above the target while directing the plasma towards the target, the second plate of the magnetron having a second open loop magnetic pole such that the first and second open loop magnetic poles align to form a closed loop magnetic pole at least once per 360 degree rotation of the first plate, wherein the first plate is disposed below the second plate and rotatably supported by the second plate, wherein the second open loop magnetic pole is fixed to the second plate with respect to the second central axis proximate an outer diameter of the first plate, and wherein the first central axis rotates about the second central axis;
sputtering metal atoms from the target using the plasma while maintaining a first pressure in the PVD chamber sufficient to ionize a predominant portion of the metal atoms sputtered from the target; and
depositing the ionized metal atoms on the substrate to form a layer thereon.

* * * * *